United States Patent
Bouttement et al.

(10) Patent No.: US 8,115,557 B2
(45) Date of Patent: Feb. 14, 2012

(54) VARIABLE INDUCTANCE CIRCUITRY FOR FREQUENCY CONTROL OF A VOLTAGE CONTROLLED OSCILLATOR

(75) Inventors: Yann Bouttement, Caen (FR); Serge Bardy, Caen (FR); Luuk F. Tiemeijer, Eindhoven (NL)

(73) Assignee: NXP B.V., Eindhoven (NL)

( * ) Notice: Subject to any disclaimer, the term of this patent is extended or adjusted under 35 U.S.C. 154(b) by 546 days.

(21) Appl. No.: 11/719,396

(22) PCT Filed: Nov. 15, 2005

(86) PCT No.: PCT/IB2005/053769
§ 371 (c)(1),
(2), (4) Date: May 6, 2009

(87) PCT Pub. No.: WO2006/051514
PCT Pub. Date: May 18, 2006

(65) Prior Publication Data
US 2010/0148882 A1    Jun. 17, 2010

Related U.S. Application Data

(60) Provisional application No. 60/628,091, filed on Nov. 15, 2004.

(51) Int. Cl.
*H03L 7/02* (2006.01)
*H03B 5/18* (2006.01)

(52) U.S. Cl. ..................................... 331/36 L; 331/181
(58) Field of Classification Search ............. 331/36 L, 331/181
See application file for complete search history.

(56) References Cited

U.S. PATENT DOCUMENTS
6,255,913 B1    7/2001    Wang
2005/0068146 A1*    3/2005    Jessie ........................... 336/200
* cited by examiner

*Primary Examiner* — Joseph Chang

(57) ABSTRACT

An electronic device is made from a first substrate with device circuitry including an inductor and a second substrate with inductance adjustment circuitry including a number of other inductors. The substrates are assembled together to be opposite one another. The other inductors are arranged to provide a selection of different mutual inductance relationships relative to the inductor. These relationships are selectable during operation of the device to provide a variable inductance in the device circuitry.

25 Claims, 3 Drawing Sheets

VARIABLE INDUCTANCE CIRCUITRY FOR FREQUENCY CONTROL OF A VOLTAGE CONTROLLED OSCILLATOR

The present invention relates to electronics, and more particularly, but not exclusively, relates to variable inductance circuitry for frequency control of a Voltage Controlled Oscillator (VCO). The associated technique to vary inductance is also suitable for other applications for which adjustable inductance is desired.

Typically, Integrated Circuit (IC) based VCOs utilize a varactor or other variable capacitance device to provide frequency adjustment over a corresponding range. As the demand for a wider frequency adjustment range has grown, so has the need for a wider range of variable capacitance. To provide a greater range of variable capacitance, circuitry has been developed that includes Metal Oxide Semiconductor (MOS) varactors with Phase-Locked Loop (PLL) control, MOS switches governed by a digital controller, and the like. In some instances, such circuit enhancements claim an unacceptable amount of coveted IC "real estate" and/or otherwise undesirably complicate the associated device. In other instances where such enhancements are acceptable, there is often a desire to expand the variable frequency range even farther. Thus, there is an ongoing need for further contributions in this area of technology.

One embodiment of the present invention is a unique variable inductance arrangement suitable for frequency control of a VCO. Other embodiments include unique methods, systems, devices, and apparatus to provide variable inductance for frequency control of a VCO and/or different applications.

A further embodiment of the present invention includes: utilizing an electronic device including a first substrate carrying device circuitry and a second substrate carrying variable inductance circuitry. This embodiment further includes electromagnetically coupling the first and second inductors to provide a mutual inductance. In one form, this coupling is facilitated by assembling the first substrate and second substrate in a spatial relationship designed to facilitate a desired form of this coupling. By way of nonlimiting example, the substrates are positioned opposite one another to place the inductors in close proximity to each other. This embodiment further includes operating the device circuitry with the first frequency range determined as a function of the mutual inductance during the coupling of the first and second inductors, changing operation of the second inductor to alter the mutual inductance therebetween, and operating the device circuitry with a second frequency range different from the first frequency range after such change. In one nonlimiting form, the device circuitry defines a voltage controlled oscillator that operates with each of the first frequency range and the second frequency range.

In another embodiment, an apparatus includes a first substrate, a second substrate assembled with the first substrate in a predefined spatial relationship, voltage controlled oscillator circuitry including a first inductor carried on the first substrate, and inductance adjustment circuitry including an inductance selection device and a second inductor. This second inductor is carried on the second substrate. The inductance selection device is structured to select between a number of inductance values for the voltage controlled oscillator circuitry by altering mutual inductance between the first inductor and the second inductor during operation of the apparatus. The different inductance values each establish a different one of a number of corresponding operating frequency ranges for the voltage controlled oscillator circuitry when selected.

Still another embodiment of the present invention includes: providing a first substrate with device circuitry including an inductor and a second substrate with inductance adjustment circuitry including one or more other inductors, assembling the first and second substrates together to facilitate formation of a desired electromagnetic coupling of the inductor to the one or more other inductors, and arranging the one or more other inductors to provide a selection of different mutual inductance relationships between the inductor and the one or more other inductors. These relationships can be selectable during operation of the electronic device to provide a variable inductance to the device circuitry from the inductor. In one nonlimiting form, each of the one or more inductors is coupled to a switch to vary mutual inductance by opening or closing a circuit path. Alternatively or additionally, the one or more other inductors number at least three.

At another embodiment includes: a voltage controlled oscillator with an inductor carried on a first substrate, one or more other inductors carried on a second substrate, and means for varying frequency range of the voltage controlled oscillator. The second substrate is assembled with the first substrate to position the inductor relative to the one or more other inductors in a manner designed to facilitate selective electromagnetic coupling. The varying means includes means for adjusting inductance in the voltage controlled oscillator by altering mutual inductance between the inductor and the one or more other inductors.

Another embodiment includes variable inductance circuitry comprising one or more first inductors that are positioned relative to one or more second inductors for selective electromagnetic coupling. A number of different mutual inductance relationships can be established between the one or more first inductors and the one or more second inductors to provide variable inductance. In one form, the relationships are selected with switches each coupled to one of the inductors. Alternatively or additionally, in another form the one or more first inductors are carried on the face of a first substrate and the one or more second inductors are carried on the face of a second substrate—where the substrates are assembled to be positioned opposite each other.

One object of the present invention is to provide a unique variable inductance arrangement suitable to vary frequency of a VCO.

Other objects include unique methods, systems, devices, and apparatus to provide variable inductance for frequency control of a voltage controlled oscillator and/or a different application.

Further objects, embodiments, forms, aspects, benefits, advantages, and features of the present application and its inventions will become apparent from the figures and description provided herewith.

Figure 1:
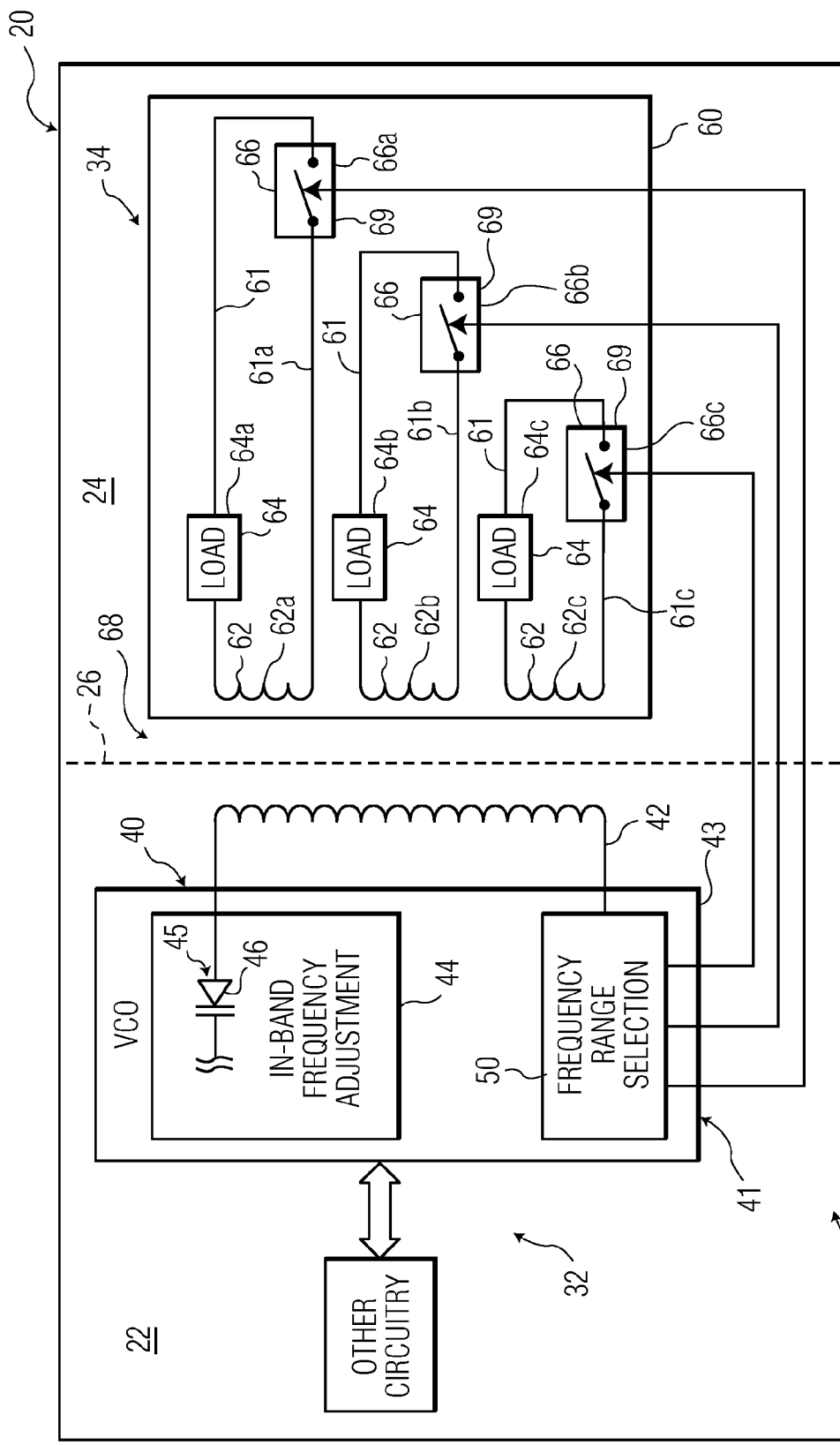
FIG. 1 is a schematic view of an electronic device including a VCO with adjustable inductance.

For the purpose of promoting an understanding of the principles of the invention, reference will now be made to the embodiments illustrated in the drawings and specific language will be used to describe the same. It will nevertheless be understood that no limitation of the scope of the invention is thereby intended. Any alterations and further modifications in the described embodiments, and any further applications of the principles of the invention as described herein are contemplated as would normally occur to one skilled in the art to which the invention relates.

FIG. 1 schematically depicts electronic device 20 of one embodiment of the present invention. Device 20 includes substrate 22 and substrate 24. Substrate 22 and substrate 24 are each symbolically represented by a rectangle, with a symbolic separation indicated by broken line 26. Substrate 22 includes electronic components that are typically of a semiconductor-based type. For embodiments including these types of components, substrate 22 typically includes a corresponding semiconductor material. Substrate 24 includes other electronic components with manufacture from suitable materials therefor, that may or may not be semiconductor based. Electronic features of device 20 that are positioned to the left of line 26 are carried with substrate 22 and features of device 20 that are positioned to the right of line 26 are carried with substrate 24. Device 20 is assembled in a "flip-chip" form as is more fully described in connection with FIGS. 2 and 3 hereinafter; however, it can take other forms as would occur to one skilled in the art.

Device 20 includes circuitry 30 carried by substrates 22 and 24. For substrate 22, circuitry 30 includes device circuitry 32. For substrate 24, circuitry 30 includes device circuitry 34. Device circuitry 32 includes Voltage Controlled Oscillator (VCO) 40 implemented with VCO circuitry 41. Circuitry 41 includes inductor 42 and subcircuitry 43 coupled thereto. Subcircuitry 43 includes in-band frequency adjustment circuit 44 to selectively vary operating frequency of VCO 40 within a desired frequency band. Circuit 44 has one or more components 45 operatively structured to provide an adjustable capacitance. One or more components 45 include at least one varactor 46, and may include other components or component types to provide desired in-band frequency adjustment. In one example, varactor 46 is of a MOS type and components 45 further include Phased-Locked Loop (PLL) control and MOS switching under direction of a digital controller.

Subcircuit 43 also includes frequency range (band) selection circuit 50. Circuit 50 is structured to select a desired frequency range, and circuit 44 is used to adjust operating frequency within such range. Circuit 50 is operatively coupled to device circuitry 34. Device circuitry 34 includes inductance adjustment circuitry 60. Circuitry 60 includes a number of adjustable circuits 61a, 61b, and 61c (collectively circuits 61). Circuits 61 each include a respective inductor 62a, 62b, or 62c (collectively designated inductors 62); a symbolically represented, lump-sum electrical load 64a, 64b, or 64c (collectively designated loads 64); and switch 66a, 66b, or 66c (collectively designated switches 66). For each of circuit 61, an electrical loop or pathway is closed to provide a "closed circuit" when the corresponding switch 66 is closed and to provide an open circuit when the corresponding switch 66 is open.

By placing inductor 42 of circuitry 41 and inductors 62 of circuits 61 in a desired spatial arrangement relative to each other and energizing VCO 40 with certain operating parameters, a selective mutual inductance can be realized between inductor 42 and one or more of inductors 62. It should be appreciated that the degree of this mutual inductance is dependent on the status of switches 66. For each switch 66, a closed state provides a closed circuit that is energized by electromagnetic coupling between the respective inductor 62 and inductor 42. This coupling corresponds to a respective mutual inductance between inductor 42 and the respective inductor 62. In contrast, for an open state of each of switches 66, the resulting open circuit alters this mutual inductance, eliminating it in the ideal case. By adjusting the switches 66 in different closed/open combinations relative to circuits 61, the degree of mutual inductance between inductor 42 and inductors 62 collectively can be adjusted. As the mutual inductance between inductor 42 and inductors 62 vary, the effective inductance provided by inductor 42 in VCO circuitry 41 varies as represented by the following equation (1) based an ideal, lumped-element model of the respective circuitry:

$$L1 = L1 - M12 - M13 - M14 \quad (1)$$

where: L1=inductance of inductor 42, M12=mutual inductance of 62a relative to inductor 42 when switch 66a is closed, M13=mutual inductance of 62b relative to inductor 42 when switch 66b is closed, and M14=mutual inductance of 62c relative to inductor 42 when switch 66c is closed. Each mutual inductance, M12, M13, and M14, is effectively removed if the corresponding switch 66 is in the open state— under the ideal model of equation (1). Accordingly, with all switches 66 open, the effective inductance of inductor 42 is L1 for this form of model.

It should be appreciated that in the nonideal case, each circuit 61 in the "open state" (corresponding switch 66 is open), may still present some degree of mutual inductance due to switch reactance and/or resistance levels, second order effects, and the like; however, it should be recognized that a predefined range of variable inductance can still be realized by taking such factors into account, and/or through calibration, as appropriate. The effective inductance provided by inductor 42, circuit 50, and circuitry 60 is alternatively designated as variable inductor 68 in FIG. 1. As depicted, switches 66 are each of a semiconductor type responsive to control signals from circuit 50; however, in other embodiments, switches 66 may be of a different type. Further, each of switches 66 are individually or in any combination operable as an inductance selection device, as designated by reference numeral 69.

As previously indicated, inductor 42 is utilized to define a frequency range (or band) of operation for VCO 40, and operating frequency adjustment within such range is performed with adjustment circuit 44. Accordingly, by varying the effective inductance of inductor 42, as realized by subcircuitry 43, a different frequency range of operation for VCO 40 can be selected. For the depicted implementation, circuit 50 controls the state of each of switches 66 to select the degree of mutual inductance between inductor 42 and one or more of inductors 62—thus offering a selection of different operating frequency bands for VCO 40. Under one approach, by varying inductance for VCO 40 with variable inductor 68, a relatively greater operating range can be realized when the same variable capacitance arrangement is utilized. Alternatively, the range of variable capacitance utilized by VCO 40 can be reduced while still providing the same effective operating frequency range through adjustment of variable inductor 68. If a variable capacitance range reduction approach is selected, at least some of the variable capacitance circuitry can potentially be eliminated to provide a simpler, less-complex design. In other embodiments, a combination of these approaches may be utilized. In still another embodiment, variable capacitance circuitry may be absent.

Figure 2:
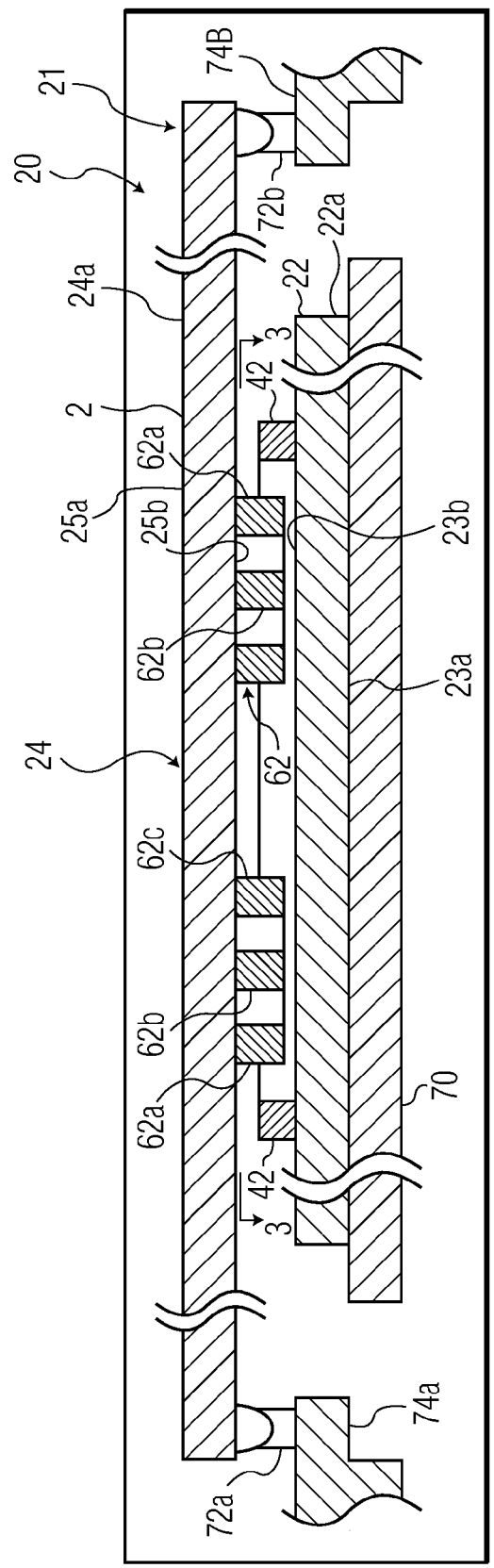
FIG. 2 is a partial sectional, diagrammatic view of the device of FIG. 1.
Figure 3:
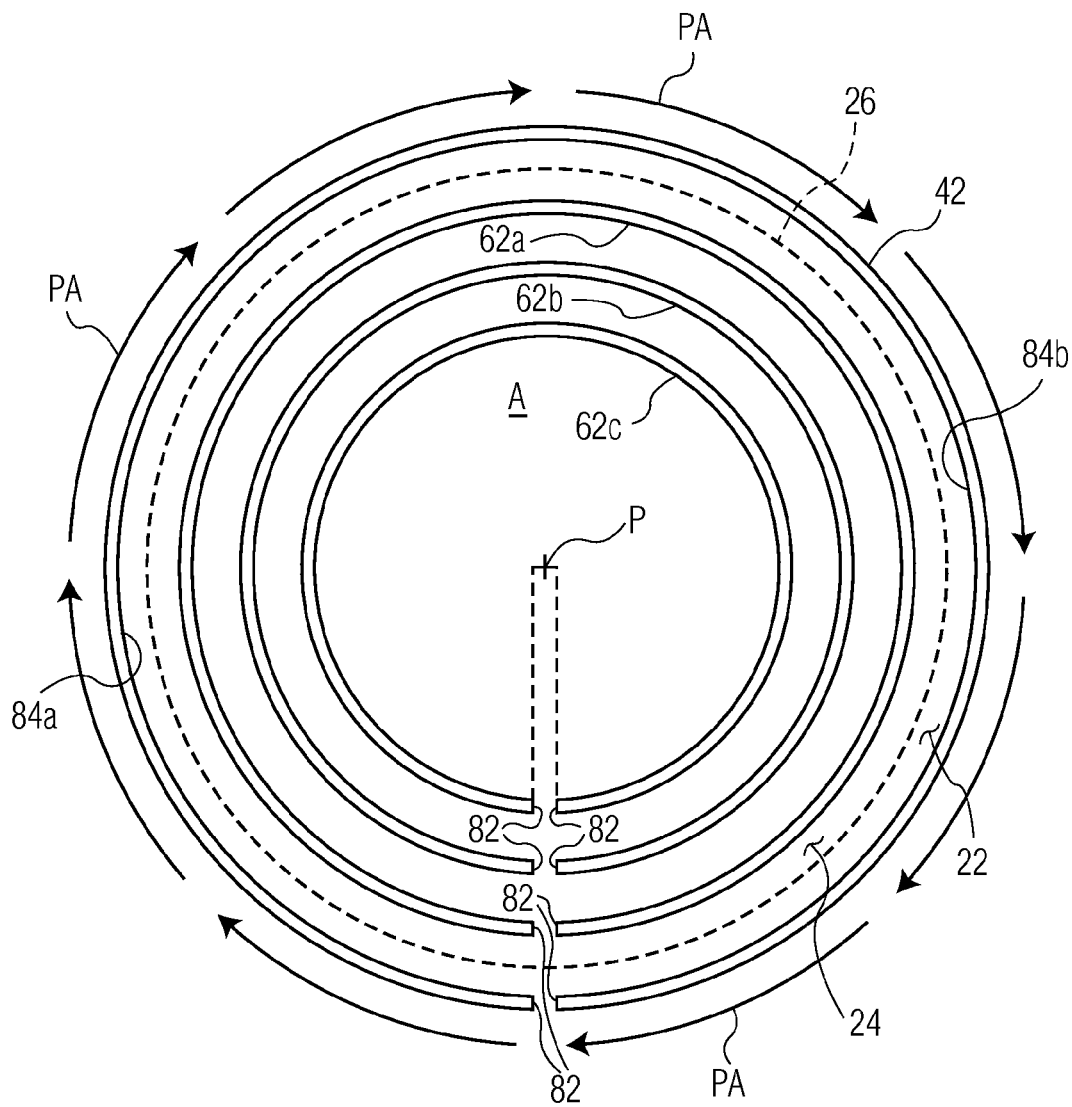
FIG. 3 is a view taken along view line 3-3 of FIG. 2 that illustrates the positional relationship between inductors included in the device of FIG. 1.

Referring to FIG. 2, device 20 is further illustrated in a partial sectional view as flip-chip structure 21; where like reference numerals refer to like features. Structure 21 includes substrates 22 and 24 in the form of active die 22a and passive die 24a, respectively. Substrate 22 includes face 23a opposite face 23b, and substrate 24 includes face 25a opposite face 25b. Substrates 22 and 24 are arranged relative to each other to establish an opposing, spaced-apart relationship between faces 23b and 25b. Inductor 42 is carried with face 231) of substrate 22 and extends towards face 25b of substrate 24. Inductors 62 are carried with face 25b of substrate 24 and each extends towards face 23b of substrate 22. Inductors 42 and 62 are each shown in section. Unless otherwise indicated, the modifiers "active" and "passive" are complementary terms used to refer to the corresponding electrical power source utilized, and not necessarily a given component type or component function. In one nonlimiting example, electromagnetic coupling with inductor 42 of active die 22 provides electrical power to circuits 61 on passive die 24; where circuits 61 may include semiconductor components. In other embodiments, dice 22a and/or 24a may not be exclusively passive or active.

Active die 22 is mounted on pedestal 70. Passive die 24 is mounted by coupling structures 72a and 72b to supports 74a and 74b, respectively, to provide an interface between inductor 42 and inductors 62. Additionally referring to FIG. 3, a view of inductors 42 and 62 is provided relative to view line 3-3 of FIG. 2, where like reference numerals refer to like features. Inductors 42 and 62 each are approximately circular and concentric relative to reference point P represented by the intersection of cross-hairs. A slight discontinuity in circularity is presented at inductor terminals 82; where a separation between terminals is shown in exaggerated form to enhance clarity. Inductor 42 and inductors 62 each include two terminals 82. At terminals 82 of inductor 42 an electrical connection to circuitry 41 is provided and at terminals 82 of inductors 62 an electrical connection to the corresponding circuit 61 is provided.

Inductors 42 and 62 are each generally planar relative to reference plane R. Reference plane R corresponding to the view plane of FIG. 3. Reference point P is coincident to reference plane R. It should be appreciated that inductors 42 and 62 each intersect a common plane coincident with or parallel to reference plane R. In correspondence, inductor 42 overlaps inductors 62, as would be observed along a line included in this common plane towards inductors 42 and 62. Inductors 42 and 62 each follow a generally planar path along plane R that turns at least 270 degrees about reference point P. This path is symbolically represented by the path of arrows PA positioned about inductors 42 and 62. Opposing sides 84a and 84b of inductor 42 defined and bounds area A therebetween. Area A is of sufficient size to receive inductors 62 therein. Correspondingly, inductors 62 collectively nest within inductor 42; inductors 62b and 62c collectively nest within inductors 42 and 62a; and inductor 62c nests within inductors 42, 62a, and 62b.

Many other embodiments of the present application are envisioned. For example, in some alternative embodiments more or fewer circuits 61, corresponding inductors, switches, and/or electrical loads may used to provide the desired inductance adjustment characteristics. In further embodiments, some or all of inductors 42 and 62 can be differently shaped or sized relative to those depicted and/or one another. Also, inductor 42 and/or any of inductors 62 can be in the form of multiple components in a series and/or parallel arrangement. Alternatively or additionally, adjustment of mutual inductance is provided by a different type of switch or another type of adjustable device structured to alter the mutual inductance generated relative to inductor 42. In still other embodiments, any of substrates 22 and 24 can be passive or active in nature, adjustment of mutual inductance to define frequency band is performed manually instead of with circuit 58, more or fewer substrates are used, and/or a different spatial relationship between inductor 42 and one or more of inductors 62 is established. In yet other embodiments, the variable inductor, with or without any of the above-indicated variations, is utilized to provide adjustable inductance in non-VCO circuitry. These alternatives represent only a few of possibilities.

While the invention has been illustrated and described in detail in the drawings and foregoing description, the same is to be considered as illustrative and not restrictive in character, it being understood that only selected embodiments have been shown and described and that all changes, modifications and equivalents that come within the spirit of the inventions described heretofore and/or defined by the following claims are desired to be protected.

What is claimed is:

1. A method, comprising:
    utilizing an electronic device including a first substrate carrying a voltage controlled oscillator circuitry and a second substrate carrying inductance adjustment circuitry, the voltage controlled oscillator circuitry including a first inductor and the inductance adjustment circuitry including a second inductor;
    electromagnetically coupling the first inductor and the second inductor to provide a mutual inductance therebetween;
    during the coupling of the first inductor and the second inductor, operating the voltage controlled oscillator circuitry with a first frequency range determined as a function of the mutual inductance;
    with the inductance adjustment circuitry, changing operation of the second inductor to alter the mutual inductance between the first inductor and the second inductor; and
    operating the voltage controlled oscillator circuitry with a second frequency range different than the first frequency range after the operation of the second inductor is changed.

2. The method of claim 1, wherein said changing includes reducing the mutual inductance between the first inductor and the second inductor.

3. The method of claim 2, wherein said reducing is performed by opening a switch coupled to the second inductor.

4. The method of claim 1, wherein the inductance adjustment circuitry includes a third inductor and further comprising: establishing a different mutual inductance between the third inductor and the first inductor; and operating the voltage controlled oscillator circuitry over a third frequency range resulting from said establishing.

5. The method of claim of 1, which includes adjusting frequency of the voltage controlled oscillator circuitry within the first frequency range by varying a capacitance established with one or more components included in the voltage controlled oscillator circuitry.

6. The method of claim 1, wherein the inductance adjustment circuitry comprises two or more inductors, the second inductor is one of the two or more inductors, the two or more inductors are structured to provide a selection of different mutual inductance relationships relative to the first inductor, the different mutual inductance relationships are selectable to vary operating frequency range of the voltage controlled oscillator circuitry, and the first substrate and the second substrate are assembled together in an opposing relationship.

7. The method of claim 6, which includes:
    selecting one of the different mutual inductance relationships to provide a desired inductance in the voltage controlled oscillator circuitry;
    operating the voltage controlled oscillator circuitry over a third frequency range determined in accordance with the desired inductance; and varying a capacitance with one or more components of the voltage controlled oscillator circuitry to adjust frequency within the third frequency range.

8. An apparatus, comprising:
a first substrate;
a second substrate assembled with the first substrate in an opposing relationship;
voltage controlled oscillator circuitry including a first inductor, the first inductor being carried on the first substrate; and
inductance adjustment circuitry including an inductance selection device and a second inductor, the second inductor being carried on the second substrate, the inductance selection device being structured to select between a number of different inductance values for the voltage controlled oscillator circuitry by altering mutual inductance between the first inductor and the second inductor during operation of the apparatus, the different inductance values each establishing a different one of a number of corresponding operating frequency ranges for the voltage controlled oscillator circuitry when selected.

9. The apparatus of claim 8, wherein the inductance selection device includes a switch connected to the second inductor in series, the mutual inductance being established by putting the switch in a closed state to form a closed circuit, and the mutual inductance being reduced or removed by putting the switch in an open state to form an open circuit.

10. The apparatus of claim 9, wherein at least one of the first inductor and the second inductor are each generally planar and each follows a path along a reference plane that turns at least 270 degrees about a coplanar reference point.

11. The apparatus of claim 9, wherein one of the first inductor and second inductor follows a path along a reference plane that bounds opposites sides of an area, the area having sufficient size to contain a path along the reference plane followed by the other of the first inductor and the second inductor.

12. The apparatus of claim 9, wherein the first inductor is carried on a first substrate face and the second inductor is carried on a second substrate face, the second substrate face opposes the first substrate face, the inductance adjustment circuitry includes a number of different inductors carried on the second substrate face, the different inductors include the second inductor, and the inductance adjustment circuitry includes means for selectively providing a number of different mutual inductance relationships relative to the first inductor in correspondence to the different inductance values.

13. The apparatus of claim 8, wherein the voltage controlled oscillator circuitry includes means for adjusting frequency within each one of the operating frequency ranges.

14. A method of making an electronic device, comprising:
providing a first substrate with device circuitry including an inductor and a second substrate with inductance adjustment circuitry including a number of other inductors;
assembling the first substrate and the second substrate together in a spatial relationship designed to provide a desired form of electromagnetic coupling of the inductor and one or more of the other inductors on a selective basis; and
arranging the other inductors to provide a selection of different mutual inductance relationships with the inductor, the different mutual inductance relationships each being selectable during operation of the electronic device to provide a variable inductance.

15. The method of claim 14, wherein the operational circuitry defines a voltage controlled oscillator with a frequency range dependent on inductance provided from the first inductor.

16. The method of claim 15, which includes defining the voltage controlled oscillator with one or more components operable to vary capacitance for adjusting operational frequency of the voltage controlled oscillator within the frequency range.

17. The method of claim 14, wherein said arranging includes providing a number of different switches each connected in series with a respective one of the other inductors, the different switches each being operable to select between a closed or open circuit path relative to the respective one of the other inductors to correspondingly select among the different mutual inductance relationships.

18. The method of claim 14, wherein the other inductors are each planar and are arranged in a nesting relationship relative to one another.

19. The method of claim 14, wherein the other inductors number at least three.

20. The method of claim 14, wherein the inductor is carried on a first substrate face and the other inductors are carried on a second substrate face, the first substrate face opposes the second substrate face, and the inductor follows a planar path that turns at least 270 degrees about a coplanar reference point.

21. The method of claim 20, wherein the other inductors each follow a corresponding one of a number of approximately coplanar paths that turn at least 270 degrees about a common point.

22. The method of claim 14, which includes: making the first substrate from a semiconductor material; and forming a number of semiconductor devices carried with the first substrate, the semiconductor devices each being included in the device circuitry.

23. An apparatus, comprising:
a voltage controlled oscillator including an inductor carried on a first substrate;
one or more other inductors carried on a second substrate, the second substrate being assembled together with the first substrate to position the first substrate and the second substrate in a spatial relationship defined to provide electromagnetic coupling between the inductor and the one or more other inductors on a selective basis; and
means for varying frequency range of the voltage controlled oscillator, the varying means including means for adjusting inductance in the voltage controlled oscillator by altering mutual inductance between the inductor and the one or more other inductors.

24. The apparatus of claim 23, further comprising means for varying operating frequency of the voltage controlled oscillator within the frequency range.

25. The apparatus of claim 23, wherein the other inductors number at least three and are arranged in an approximately coplanar nesting relationship relative to one another.

* * * * *